United States Patent
Zheng et al.

(10) Patent No.: US 6,879,009 B2
(45) Date of Patent: *Apr. 12, 2005

(54) INTEGRATED CIRCUIT WITH MOSFETS HAVING BI-LAYER METAL GATE ELECTRODES

(75) Inventors: Jun-Fei Zheng, Palo Alto, CA (US); Chunlin Liang, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/679,969

(22) Filed: Oct. 6, 2003

(65) Prior Publication Data

US 2004/0065903 A1 Apr. 8, 2004

Related U.S. Application Data

(60) Division of application No. 09/475,484, filed on Dec. 30, 1999, now Pat. No. 6,696,333, which is a continuation-in-part of application No. 09/451,696, filed on Nov. 30, 1999, now Pat. No. 6,373,111.

(51) Int. Cl.⁷ .............................. H01L 31/119
(52) U.S. Cl. .................. 257/407; 257/412; 438/585
(58) Field of Search ................ 257/407, 401, 257/410–412, 315, 347, 364–369

(56) References Cited

U.S. PATENT DOCUMENTS

| | | | |
|---|---|---|---|
| 6,028,339 A | 2/2000 | Frenette et al. |
| 6,091,120 A | 7/2000 | Yeom et al. |
| 6,140,688 A | 10/2000 | Gardner et al. |
| 6,171,910 B1 | 1/2001 | Hobbs et al. |
| 6,373,111 B1 | 4/2002 | Zheng et al. |
| 2002/0008257 A1 | 1/2002 | Barnak et al. |

*Primary Examiner*—Dung A. Le
(74) *Attorney, Agent, or Firm*—Blakely, Sokoloff, Taylor & Zafman LLP

(57) ABSTRACT

A method of fabricating integrated circuits includes forming MOSFETs with gate electrodes of a first composition, and sidewall spacers along laterally opposed sides of those gate electrodes, removing the gate electrodes of the first composition, and replacing those gate electrodes with a gate electrode structure having at least two layers of metal. In a further aspect of the present invention, complementary metal oxide semiconductor integrated circuits are fabricated by replacing n-channel transistor gate electrodes with gate electrodes having at least a first metal and a second metal, and further replacing the p-channel transistor gate electrodes with gate electrodes having a third metal and a fourth metal. The first and second metal combination includes, but is not limited to, TiN and Al. The third and fourth metal combination includes, but is not limited to, TaN and Ni; TaN and Pd; and TaN and Pt.

17 Claims, 13 Drawing Sheets

INTEGRATED CIRCUIT WITH MOSFETS HAVING BI-LAYER METAL GATE ELECTRODES

RELATED APPLICATIONS

The present application is a divisional of U.S. patent application Ser. No. 09/475,484 filed Dec. 30, 1999 now U.S. Pat. No. 6,696,333, entitled "INTEGRATED CIRCUIT WITH MOSFETS HAVING BI-LAYER METAL GATE ELECTRODES METHOD OF MAKING SAME". The Ser. No. 09/475,484 application is itself a continuation-in-part application of U.S. patent application Ser. No. 09/451,696 filed Nov. 30, 1999, now U.S. Pat. No. 6,373,111.

This application is a continuation in part of application Ser. No. 09/451,696, filed on Nov. 30, 1999, entitled "Work Function Tuning For MOSFET Gate Electrodes".

BACKGROUND OF THE INVENTION

1. Field of the Invention

The invention relates generally to the structure and fabrication of integrated circuits, and more particularly to integrated circuits having metal oxide semiconductor field effect transistors (MOSFETs) with multi-layer metal gate electrodes.

2. Background

Advances in semiconductor manufacturing technology have led to the integration of tens, and more recently hundreds, of millions of circuit elements, such as transistors, on a single integrated circuit (IC). To achieve such dramatic increases in the density of circuit components has required semiconductor manufacturers to scale down the physical dimensions of the circuit elements, as well as the interconnection structures used to connect the circuit elements into functional circuitry.

One consequence of scaling down the physical dimensions of circuit elements has been a dramatic increase in the complexity of transistor engineering for the process engineers and scientists that develop advanced microelectronic manufacturing processes. In the past it was common to consider gate oxide thickness, polysilicon line width, source/drain junction depth and lateral diffusion therefrom, and some threshold adjusting ion implant as the primary parameters of transistor design. However as transistor dimensions entered the deep submicron region, the transistor structure became more complex with the inclusion of elements such as graded well doping, epitaxial wafers, halo implants, tip implants, lightly doped drain structures, multiple implants for source/drain formation, silicidation of gates and source/drains, and multiple sidewall spacers, among others. Because of the complex nature of deep submicron transistors, workers in this field tend to characterize, or specify, transistors not so much by physical dimension (e.g., gate length) but rather by electrical characteristics such as drive current ($I_{on}$) versus leakage current ($I_{off}$).

For high speed operation of microelectronic components, circuit designers prefer transistors tuned for high drive currents. On the other hand, low leakage, i.e., low off-state current, is preferred so as to reduce power consumption. Typically, the structural and doping parameters that tend to provide the desired increase in drive current also tend to provide an undesired increase in leakage current. Use of metal gates will tend to improve drive current performance by reducing or eliminating the poly depletion effect. Unfortunately, many metals, while reducing or eliminating the poly depletion effect when used to form a gate electrode, will undesirably result in increased leakage current because the work function of that metal gate is not appropriate for providing the desired transistor threshold voltage.

What is needed are structures and methods for obtaining the desired electrical performance from insulated gate field effect transistors.

Additionally what is needed are structures suited for complementary metal oxide semiconductor (CMOS) integrated circuits, and methods of making such integrated circuits that are suitable for integration into a manufacturing process.

SUMMARY OF THE INVENTION

Briefly, a method of fabricating integrated circuits includes forming MOSFETs with gate electrodes of a first composition, and sidewall spacers along laterally opposed sides of those gate electrodes, removing the gate electrodes of the first composition, and replacing those gate electrodes with a gate electrode structure having at least two layers of conductive material.

In a further aspect of the present invention, complementary metal oxide semiconductor integrated circuits are fabricated by replacing n-channel transistor gate electrodes with gate electrodes having at least a first metal and a second metal, and further replacing the p-channel transistor gate electrodes with gate electrodes having a third metal and a fourth metal.

DETAILED DESCRIPTION

Overview

Figure 1:
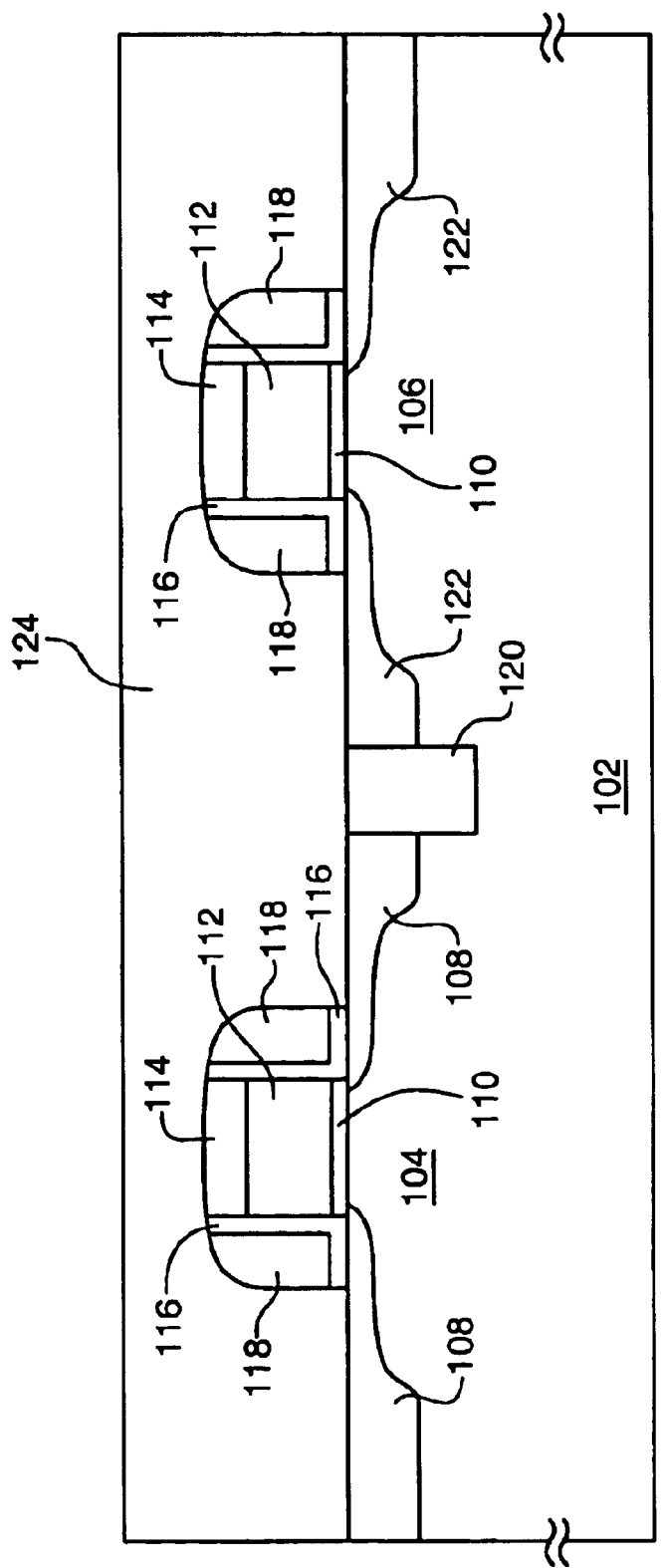
FIG. 1 is a schematic cross-section of a partially fabricated integrated circuit showing a p-channel field effect transistor (PFET) and an n-channel field effect transistor (NFET), each of the FETs having a silicided polysilicon gate electrode.

In exemplary embodiments of the present invention, partially fabricated integrated circuits have their polysilicon gate electrodes removed and replaced with bi-layer metal gate electrodes. The replacement gate electrodes overcome the carrier depletion effect experienced with polysilicon gate electrodes. Additionally, the work functions of replacement gate electrodes are controlled by the thickness of one of the at least two conductive materials used to form the replacement gate electrodes. More particularly, the thickness of the conductive material disposed superjacent a gate dielectric layer (i.e., the "bottom" conductor) is important in determining the work function of the gate.

CMOS manufacturing processes in accordance with the present invention may include fabricating PFETs, NFETs, and a dielectric layer (often referred to in this field as ILD0) formed over and between the FETs. Typically, the dielectric layer is planarized. The gate electrodes of the FETs may be formed of patterned polysilicon, and may further have silicided top portions. A photomasking operation is performed to protect the dielectric material overlying one the transistor types and leave the other exposed. For example, the dielectric overlying the NFETs may be protected by photoresist while the dielectric overlying the PFETs is exposed. In this way, the dielectric overlying the PFETs can be removed, typically by an etch process, thereby exposing the silicided top portion of the PFET gate electrode. The silicide is then removed, typically by an etch process, thereby exposing the underlying polysilicon portion of the gate electrode. The remaining photoresist is typically stripped at this point. The polysilicon can then be removed by etching. After the polysilicon is removed, the gate dielectric layer is removed by etching. It is important that the sidewall spacers (also referred to simply as spacers) that surround the laterally opposed sides of the gate electrodes be resistant to the etch chemistries used to remove the silicide, polysilicon and gate dielectric portions of the FET. A new gate dielectric layer is then formed. Typically the gate dielectric is an oxide of silicon formed by oxidation of the surface of the substrate, however, other materials and methods of formation are known in this field. A bi-layer metal gate can then be formed, self-aligned to the spacers. A thin layer of metal such as, for example, TaN, is deposited over the integrated circuit such that it covers at least the gate dielectric layer. Typically, the interior walls of the spacers are also covered with the thin metal layer. A second metal layer, such as, for example, Ni, Pd, or Pt, is then deposited over the integrated circuit such that it at least substantially fills the recess formed by the sidewall spacers. Excess metal is then removed, typically by a dry etching operation. Excess metal refers to portions of the first and second metal that are outside the recess defined by the spacers. The metal may be slightly overetched such that the top surface of the metal gate electrode is recessed from the top portion of the spacers. A dielectric material is deposited over at least that portion of the integrated circuit that includes the PFETs. The process can then be repeated for the NFET portion of the integrated circuit. For NFETs, the first metal layer may be TiN and the second metal may be Al, but the present invention is not limited to this combination.

Insulated gate field effect transistors having gate electrodes with at least two layers of materials can provide gate electrode work function values that are similar to those of doped polysilicon, eliminate the poly depletion effect and also substantially prevent impurity diffusion into the gate dielectric. Bi-layer stacks of a relatively thick conductive layer superjacent a relatively thin conductive layer (typically <100 angstroms) which is in turn superjacent the gate dielectric achieve the desired electrical characteristics. Illustrative embodiments of the present invention are disclosed which include bi-layer stacks of relatively thick Al and thin TiN for NFETs, and bi-layer stacks of relatively thick Pd and thin TiN, or relatively thick Pd and thin TaN for PFETs. Varying the thickness of the thin TiN or TaN layers between a first and second critical thickness may be used to modulate the work function of the gate electrode and thereby obtain a desirable trade-off between channel doping and drive currents in FETs.

Terminology

The terms, chip, integrated circuit, monolithic device, semiconductor device or component, microelectronic device or component, and similar expressions, are often used interchangeably in this field. The present invention is applicable to all the above as they are generally understood in the field.

The term "gate" is context sensitive and can be used in two ways when describing integrated circuits. While the term gate may refer to a circuit for realizing an arbitrary logical function when used in the context of a logic gate, as used herein, gate refers to the insulated gate electrode of a three terminal FET. Although a FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of an electric field resulting from a voltage applied to the gate terminal, or electrode. Source/drain terminals are typically formed in a semiconductor substrate and have a conductivity type (i.e., p-type or n-type) that is the opposite of the conductivity type of the substrate. Sometimes, source/drain terminals are referred to as junctions. Generally, the source and drain terminals are fabricated such that they are geometrically symmetrical. Source/drain terminals may include extensions, sometimes referred to as tips, which are shallower than other portions of the source/drain terminals. The tips typically extend toward the channel region of a FET, from the main portion of the source/drain terminal. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

The term vertical, as used herein, means substantially perpendicular to the surface of a substrate.

In the following description, numerous specific details are set forth to provide a thorough understanding of the present invention. However, one having ordinary skill in the art should recognize that the invention may be practiced without these specific details. In some instances, well-known structures and techniques have not been shown in detail to avoid obscuring the present invention. Illustrative embodiments of the present invention are described in conjunction with FIGS. 1–13.

Referring to FIG. 1, a schematic cross-section of a partially fabricated integrated circuit having a conventional PFET and a conventional NFET is shown. In this embodiment, the NFET and PFET are constructed from wellknown materials and by known methods. For example, the FETs each include a polysilicon gate electrode 112 having a silicided top portion 114. The FETs further have sidewall spacers which are also known structural elements. In the exemplary structure of FIG. 1, the sidewall spacers include two layers. More particularly, the sidewall spacers include a first layer 116, immediately adjacent polysilicon 112 and silicide 114, and a second layer 118 which is spaced apart from polysilicon 112 and silicide 114 by the width of the first layer. In alternative embodiments a single layer sidewall spacer of a material such as silicon nitride may be used. The PFET includes p-type source/drain terminals 108, and the NFET includes n-type source/drain terminals 122. The PFET and NFET are laterally spaced apart from each other in substrate 102, and are further electrically isolated from one another by shallow trench isolation structure 120. Additionally, the doping of substrate 102 is n-type in region 104 and p-type in region 106. The doped regions 104 and 106 are often referred to as wells. PFETs may be formed in n-wells and NFETs may be formed in p-wells. Methods for fabricating the structures of FIG. 1 are well known to those skilled in the art and are not further described here. The structure of FIG. 1 serves as the starting point for embodiments of the present invention.

Figure 2:
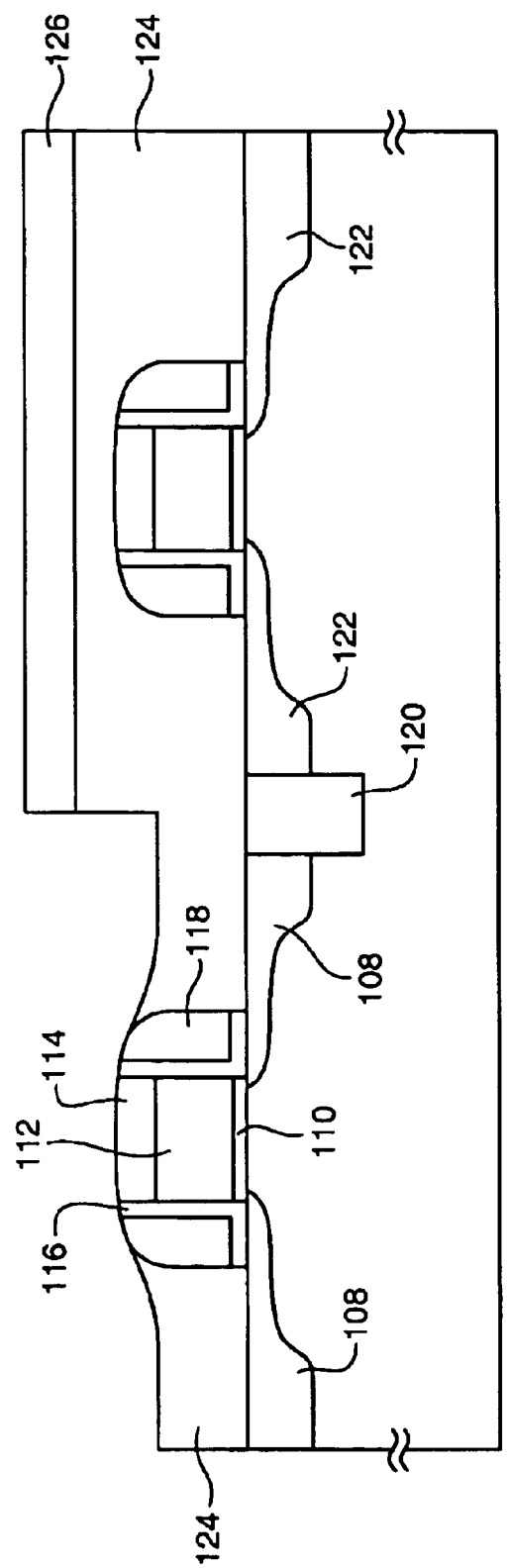
FIG. 2 is a schematic cross-section of the integrated circuit of FIG. 1 after the process operations of forming a patterned photoresist layer over the NFET, and removing the dielectric material overlying the PFET.
Figure 3:
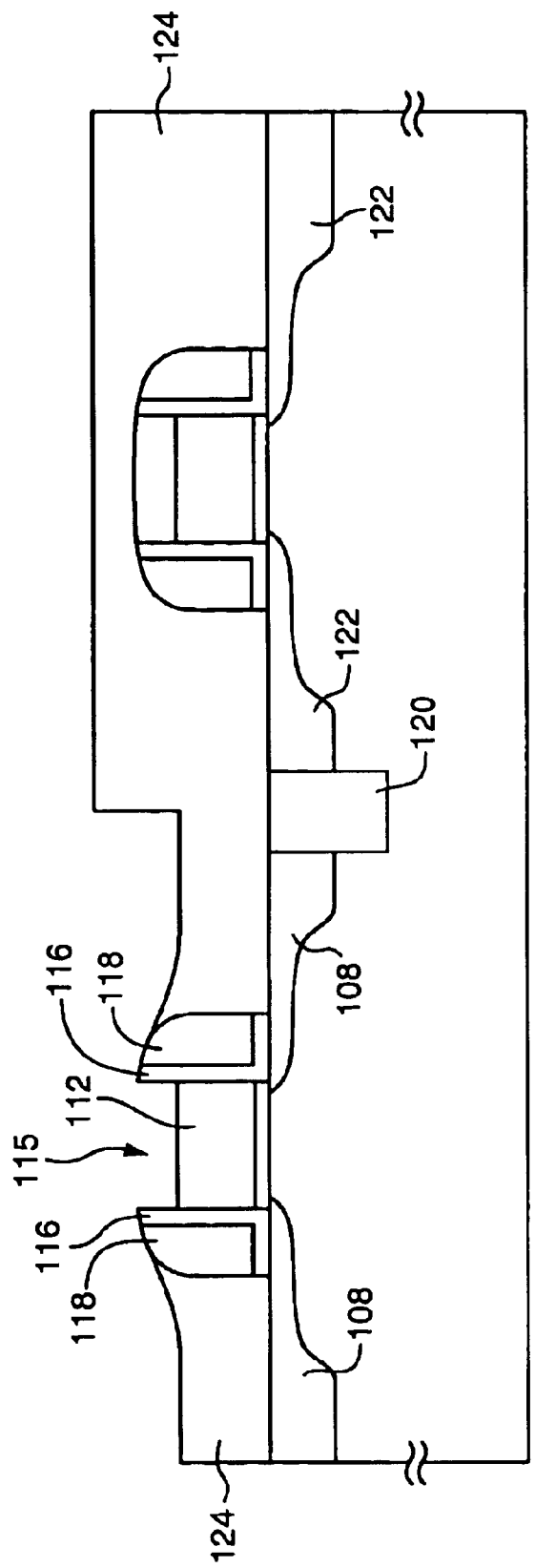
FIG. 3 is a schematic cross-section of the integrated circuit of FIG. 2 after the process operations of removing the photoresist, and etching the silicide portion of the PFET gate electrode.

Referring now to FIG. 2, a schematic cross-section of the integrated circuit of FIG. 1 is shown, after the process operations of forming a patterned photoresist layer 126 over the NFET, and removing a portion of dielectric material 124 overlying the PFET. Dielectric material 124 is typically, but not required to be, an oxide of silicon, and can be removed by any suitable wellknown chemical etching process that provides appropriate selectivity between dielectric material 124 and the sidewall spacers adjacent to the gate electrode. FIG. 3 shows the structure of FIG. 2 after the process operations of removing silicide 114 from the top portion of the PFET gate electrode, and removing photoresist 126. A recess 115 is created by the removal of silicide 114 as shown in FIG. 3. A typical process forms a silicide layer on top of a polysilicon gate electrode at the same time that the source/drain regions are silicided. In an alternative process, a layer of material such as, for example, silicon nitride may be disposed over the polysilicon portion of the gate electrode to prevent the formation of a silicide layer thereon. In such an alternative process, the operation of removing silicide layer 114 is unnecessary.

Figure 4:
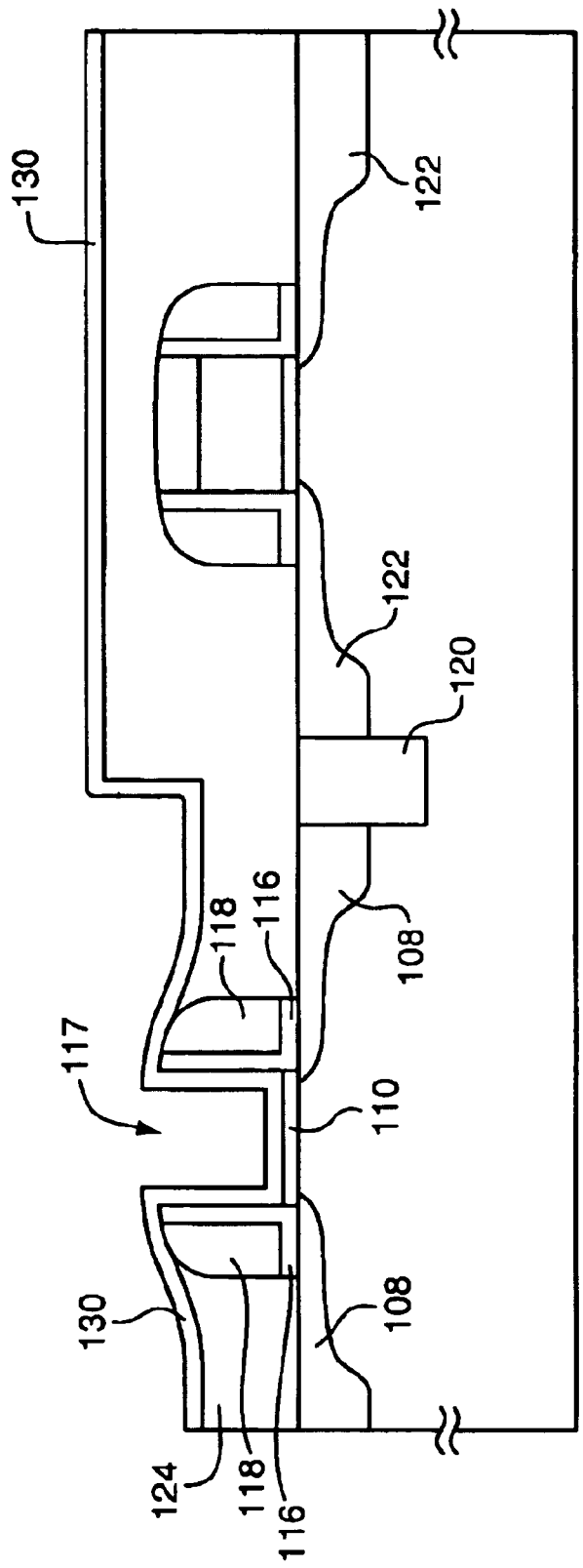
FIG. 4 is a schematic cross-section of the integrated circuit of FIG. 3 after the process operations of removing the polysilicon portion of the gate electrode, removing the gate oxide layer, re-growing the gate oxide, and depositing a thin layer of TaN.

FIG. 4 shows the structure of FIG. 3 after the process operations of removing polysilicon 112 from the PFET, thereby creating recess 117, which is larger than recess 115. Recess 117, formed by the removal the PFET gate electrode (i.e., silicide 114 and polysilicon 112), exposes the interior walls of the sidewall spacers of the PFET. In the illustrated embodiment of the present invention, wherein the sidewall spacers are comprised of two materials, it is the interior walls of the innermost material that are exposed. The innermost material is that which is immediately adjacent to the gate electrode. FIG. 4 also shows a thin layer of metal 130 formed over the surface of the partially completed integrated circuit, including over the interior walls of the sidewall spacers and over a gate dielectric layer 110. In the illustrated embodiment, metal 130 is a layer of tantalum nitride about 20 angstroms thick formed by chemical vapor deposition (CVD). The thickness of the TaN may be more or less than 20 angstroms.

Prior to the deposition of tantalum nitride 130, gate dielectric 110 may be removed and re-formed. In this way, damage to gate dielectric 110 that may have occurred during the removal of polysilicon 112, can be repaired. Typically the gate dielectric is an oxide of silicon, however any suitable material, or combination of materials may be used as the gate dielectric. For example, a silicon oxynitride layer might be used. The specific nature of the gate dielectric including its composition and thickness, is not a part of this invention. The present invention may be used with any suitable gate dielectric structure.

Figure 5:
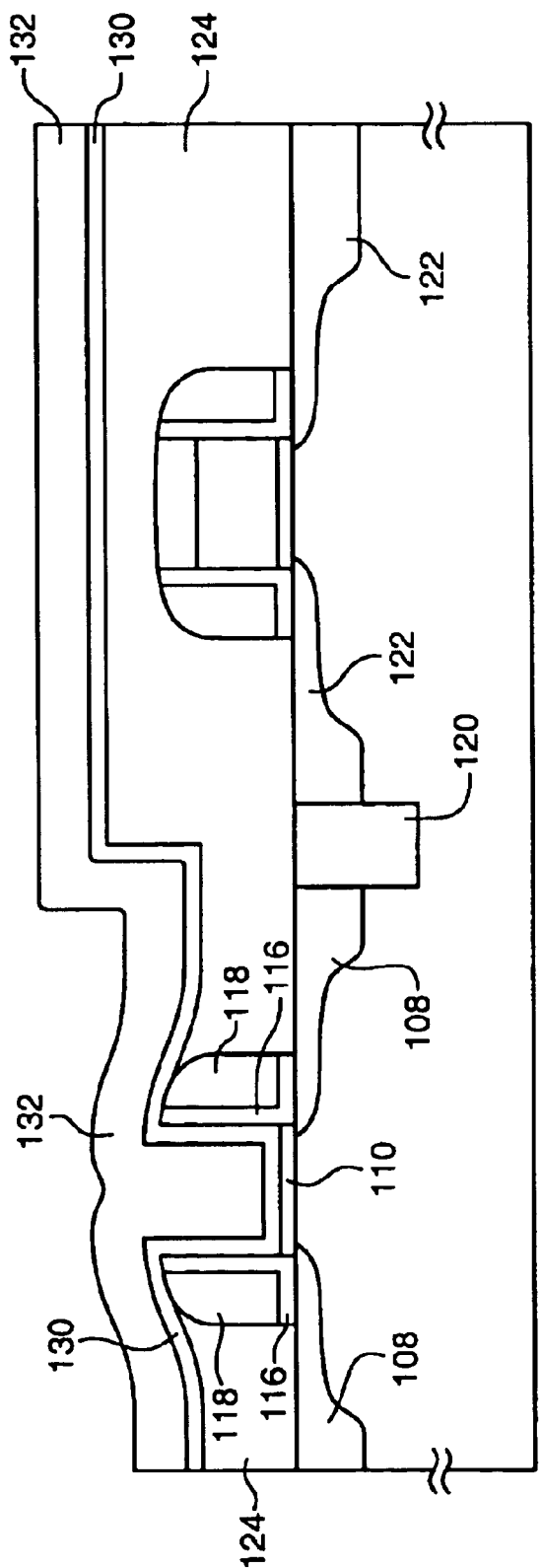
FIG. 5 is a schematic cross-section of the integrated circuit of FIG. 4 after the process operations of depositing a layer of metal over the thin layer of TaN.

FIG. 5 shows the structure of FIG. 4, after the processing operations of forming a second metal layer 132 over tantalum nitride 130. As shown in the figure, second metal layer 132 is thicker than tantalum nitride layer 130, and second metal layer 132 substantially fills recess 117. For PFETs, second metal layer 132 is typically a metal selected from among nickel, platinum, and palladium. However, the present invention is not limited to these metals and other conductive materials may be used as long as it provides desirable work function. Diffusion of impurity atoms into gate dielectric layer 110 may result in the PFET having undesired electrical characteristics. Therefore, it is desirable that metal layer 130 act as an effective barrier to the diffusion of atoms from second metal layer 132 into gate dielectric 110. It is also desirable that the combination of the first and second materials that form the new gate electrode of the PFET overcome the carrier depletion effect at the gate/gate dielectric interface typically experienced by polysilicon gate electrodes.

Figure 6:
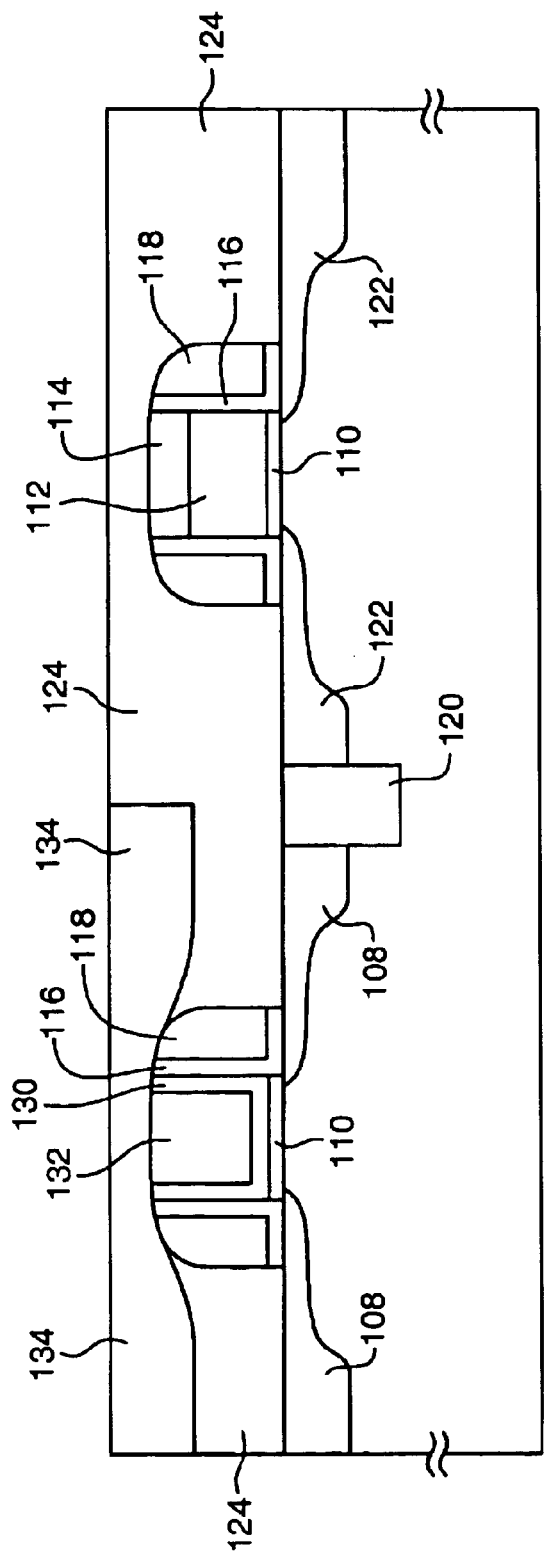
FIG. 6 is a schematic cross-section of the integrated circuit of FIG. 5 after the process operations of removing the excess metal so as to complete the PFET replacement gate electrode, and forming a dielectric layer over the PFET regions of the integrated circuit.

Referring to FIG. 6, a schematic cross-section of the integrated circuit of FIG. 5, after the performance of various processing operations is shown. More particularly, FIG. 6 shows the structure of FIG. 5 after removing the excess metal of layers 132 and 130 to form the replacement gate electrode structure and after a layer of dielectric material, for example tetra ethyl orthosilicate (TEOS), is formed over the PFET, to protect the PFET from subsequent processing operations. The excess metal is typically removed by conventional dry etching methods which are well known in this field.

Once the gate electrodes of the PFETs in the integrated circuit have been replaced, the gate electrodes of the various NFETs can be replaced. The particular order of gate replacement is not critical to the present invention. That is, NFET gate electrodes may be replaced prior to PFET gate electrodes. Similarly, various subsets of same conductivity type transistors may be replaced in arbitrary order. In other words a first set of NFETs may have gate replacement, followed by a second set of NFETs, followed in turn by a first set of PFETs. In this way, same conductivity type transistors may have different gate replacement processing so as to provide different materials or different thicknesses of materials for the new gate electrode structures. By varying the materials and/or the thicknesses of the various materials, the gate electrode work function, and in turn the transistor threshold voltage may be uniquely set without requiring additional ion implantation into the channel region.

Figure 7:
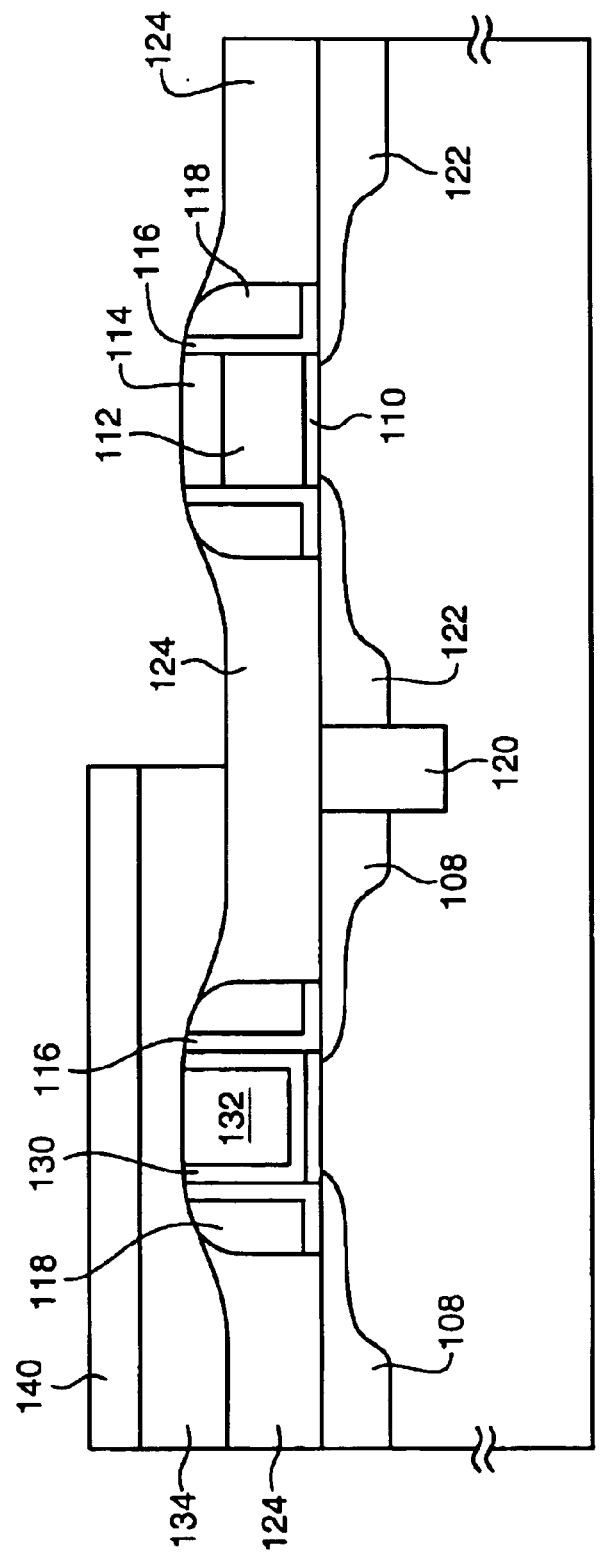
FIG. 7 is a schematic cross-section of the integrated circuit of FIG. 6 after the process operations of forming a patterned photoresist layer over the PFET, and removing the dielectric material overlying the NFET.
Figure 8:
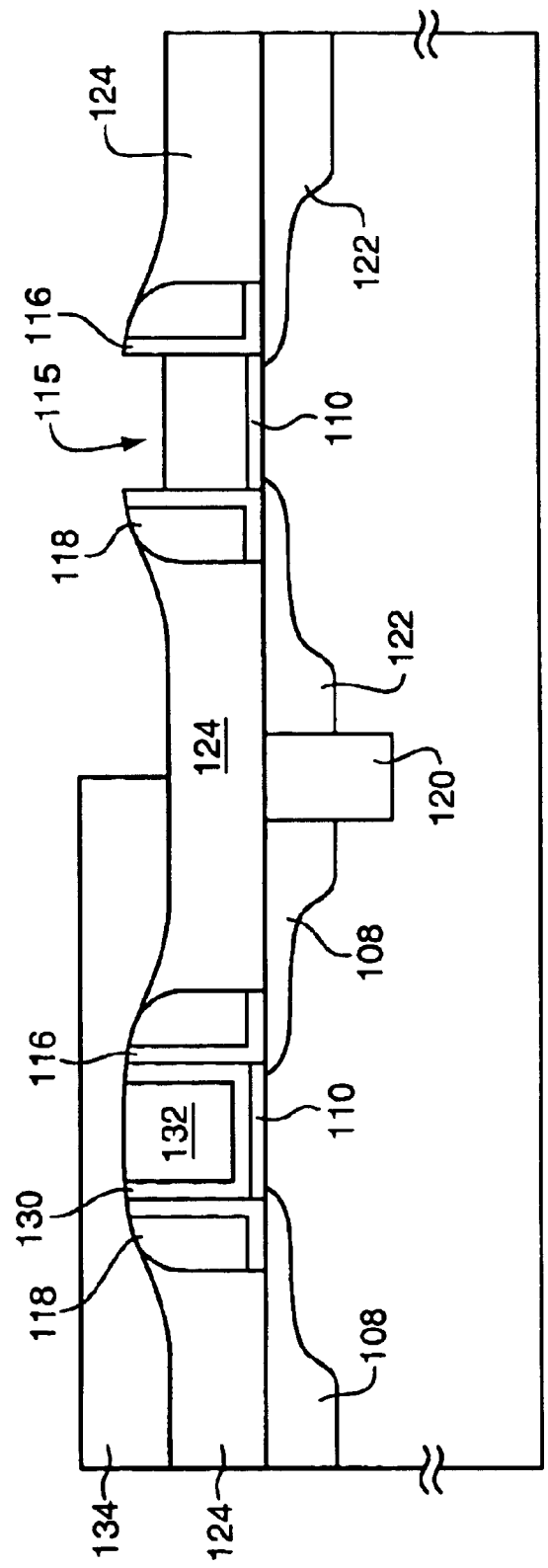
FIG. 8 is a schematic cross-section of the integrated circuit of FIG. 7 after the process operations of removing the photoresist and removing the silicide portion of the NFET gate electrode.

Referring to FIG. 7, a portion of the process of NFET gate replacement is described. As shown, a photoresist layer 140 is patterned such that dielectric layer 134 over the PFET is protected. Portions of dielectric layer 124 over the NFET are removed, thereby exposing the top portion of the NFET. As can be seen in FIG. 8, silicide layer 114 of the NFET gate electrode is removed, leaving a recess 115, and photoresist 140 is also removed. A typical process forms a silicide layer on top of a polysilicon gate electrode at the same time that the source/drain regions are silicided. As described above in connection with FIG. 3, in an alternative process, a layer of material such as, for example, silicon nitride, may be disposed over the polysilicon portion of the gate electrode to prevent the formation of a silicide layer thereon. In such an alternative process, the operation of removing silicide layer 114 is unnecessary.

Figure 9:
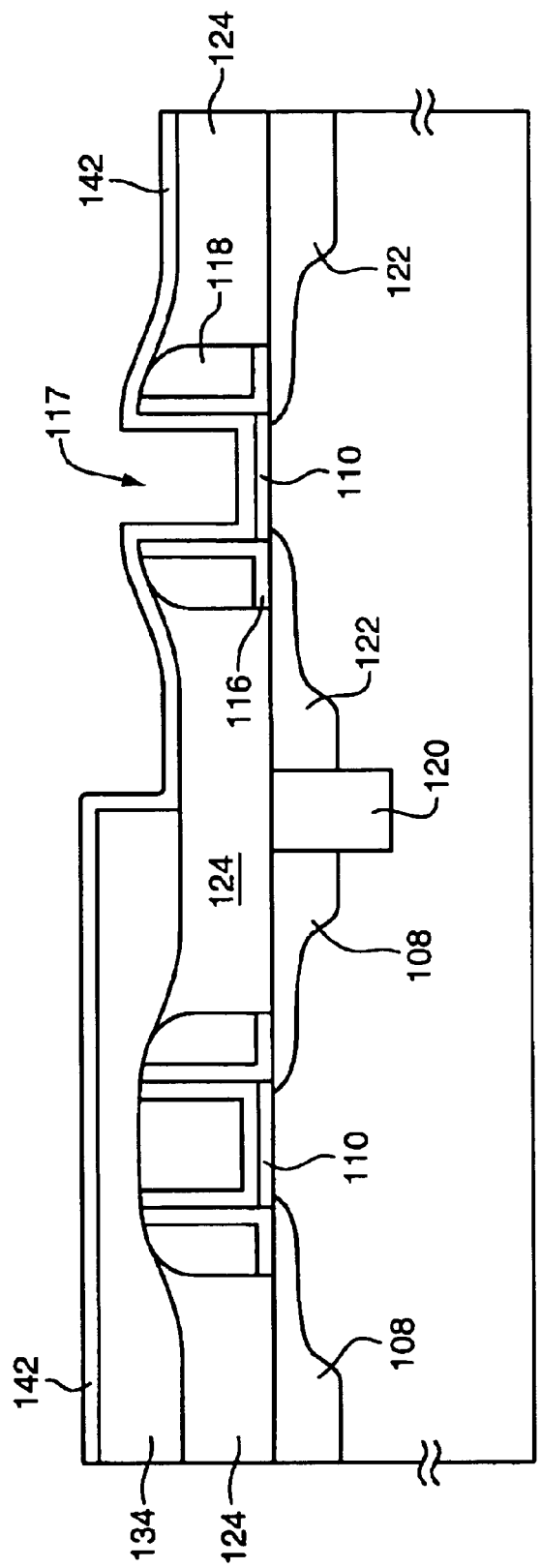
FIG. 9 is schematic cross-section of the integrated circuit of FIG. 8 after the process operations of removing the polysilicon portion of the gate electrode, removing the gate oxide layer, re-growing the gate oxide, and depositing a thin layer of TiN.

FIG. 9 shows the structure of FIG. 8, after the processing operations of removing polysilicon 114 from the NFET gate electrode structure, thereby creating recess 117. Recess 117, formed by the removal the NFET gate electrode (i.e., silicide 114 and polysilicon 112), exposes the interior walls of the sidewall spacers of the NFET. In the illustrated embodiment of the present invention, wherein the sidewall spacers are comprised of two materials, it is the interior walls of the innermost material that are exposed. The innermost material is that which is immediately adjacent to the gate electrode. FIG. 9 also shows a thin layer of metal 142 formed over the surface of the partially completed integrated circuit, including over the interior walls of the sidewall spacers and over a gate dielectric layer 110. In the illustrated embodiment, metal 142 is a layer of titanium nitride about 20 angstroms thick formed by CVD. The thickness of the TiN may be more or less than 20 angstroms.

As described above in connection with the formation of the PFET replacement gate electrode, prior to the deposition of titanium nitride 142, gate dielectric 110 may be removed and reformed. In this way, damage to gate dielectric 110 that may have occurred during the removal of polysilicon 112, can be repaired. The present invention may be used with any suitable gate dielectric structure.

Figure 10:
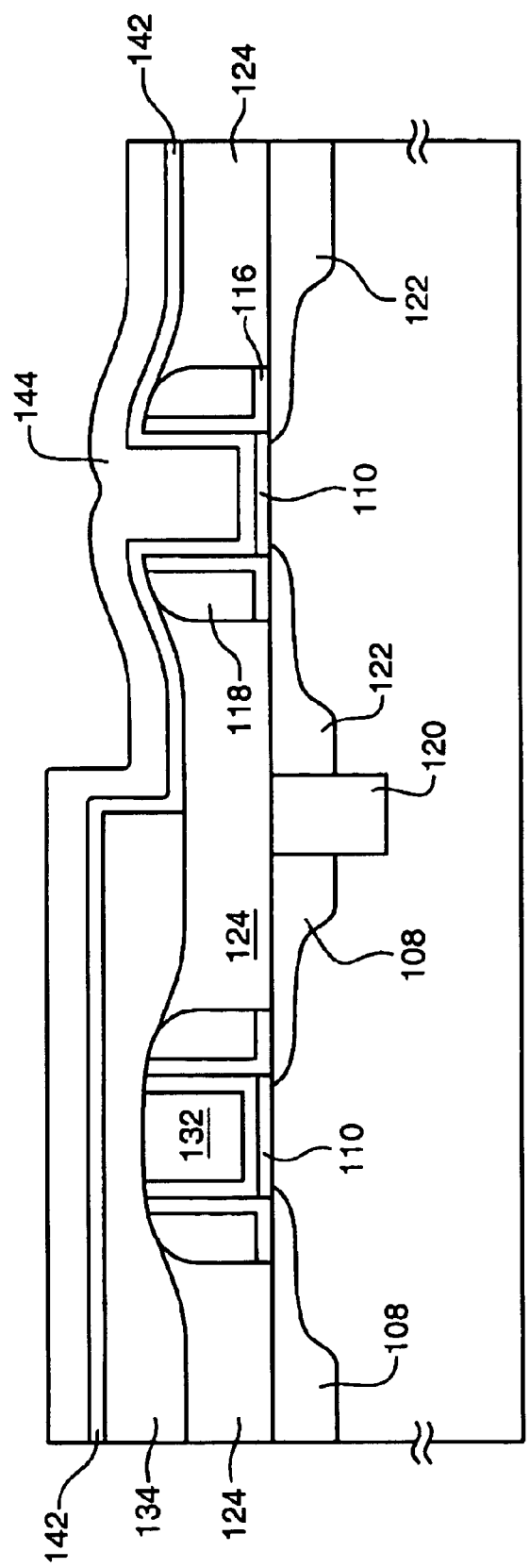
FIG. 10 is schematic cross-section of the integrated circuit of FIG. 9 after the process operations of depositing a layer of metal over the thin layer of TiN.

FIG. 10 shows the structure of FIG. 9 after the processing operations of forming a second metal layer 144 over titanium nitride 142. As shown in the figure, second metal layer 144 is thicker than titanium nitride layer 142, and second metal layer 144 substantially fills recess 117. For NFETs, second metal layer 144 is typically a metal such as, but not limited to, aluminum and titanium. Other conductive materials may be used as long as they provide the desired work function. Diffusion of impurity atoms into gate dielectric layer 110 may result in the NFET having undesired electrical characteristics. Therefore, it is desirable that metal layer 142 act as an effective barrier to diffusion of atoms from second metal layer 144 into gate dielectric 110. It is also desirable that the combination of the first and second materials that form the new gate electrode of the NFET overcome the carrier depletion effect at the gate/gate dielectric interface typically experienced with polysilicon gate electrodes.

Figure 11:
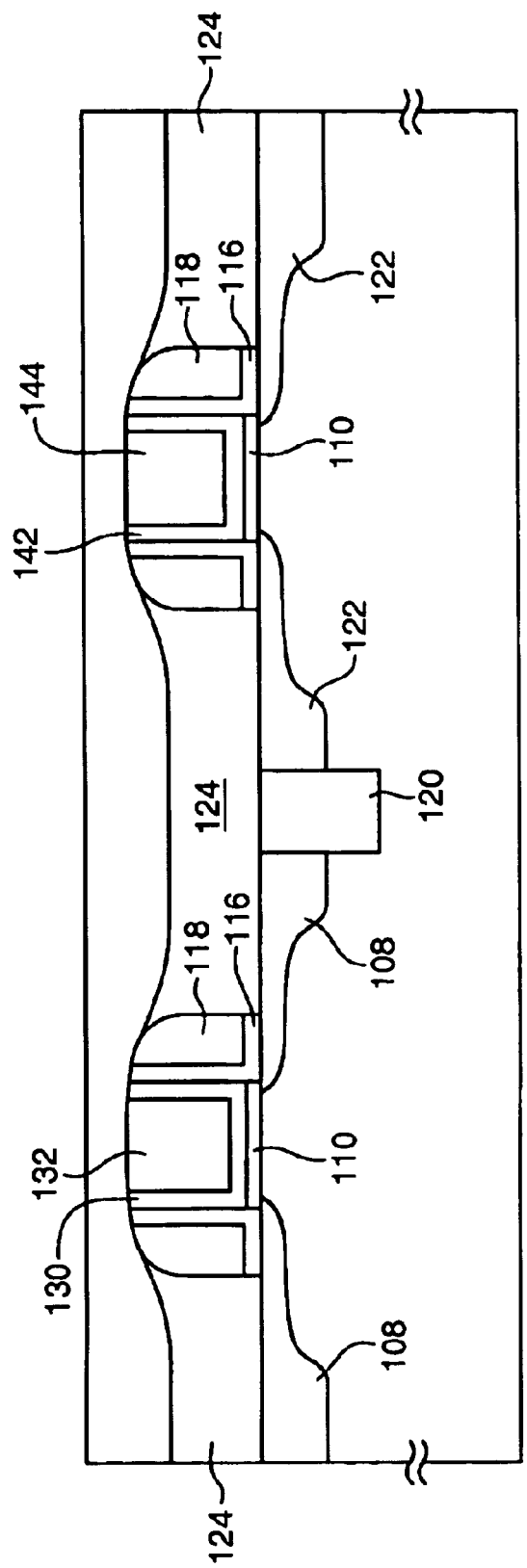
FIG. 11 is a schematic cross-section of the integrated circuit of FIG. 10 after the process operations of removing the excess metal so as to complete the NFET replacement gate electrode, and forming a dielectric layer over the NFET regions of the integrated circuit.

Referring to FIG. 11, a schematic cross-section of the integrated circuit of FIG. 10, after the performance of various processing operations is shown. More particularly, FIG. 11 shows the structure of FIG. 10 after removing the excess metal of layers 144 and 142 to form the replacement gate electrode structure and after a layer of dielectric material is formed over the transistor, for protection from subsequent processing operations. Excess metal as well as portion of TEOS 134 may be removed by chemical mechanical polishing (CMP). After which, conventional semiconductor manufacturing operations may be performed to provide a thicker dielectric layer over the transistors, and to complete the circuit interconnections needed to form the final integrated circuit. In this way, an integrated circuit containing both NFETs and PFETs with bi-layer metal gate electrodes may be produced.

Figure 12:
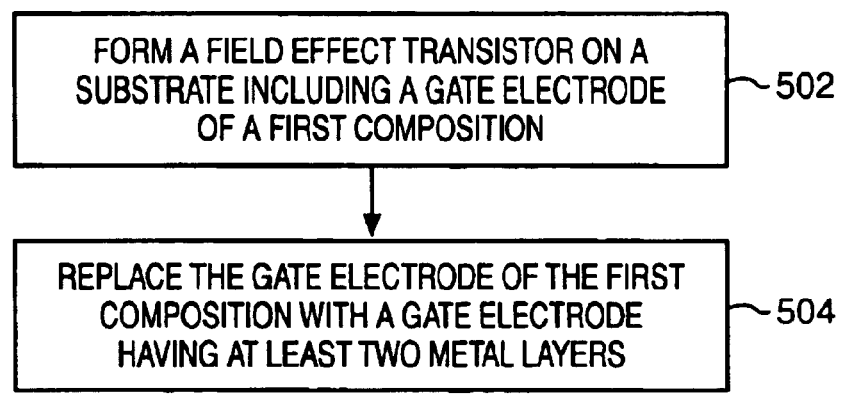
FIG. 12 is a flow diagram illustrating a process in accordance with the present invention.

FIG. 12 is a flow diagram of a process in accordance with the present invention. As shown at block 502, a field effect transistor including a gate electrode of a first composition, is formed on a substrate. As further shown at block 504, the gate electrode of the first composition is replaced with a new gate electrode structure having at least two layers of metal.

Figure 13:
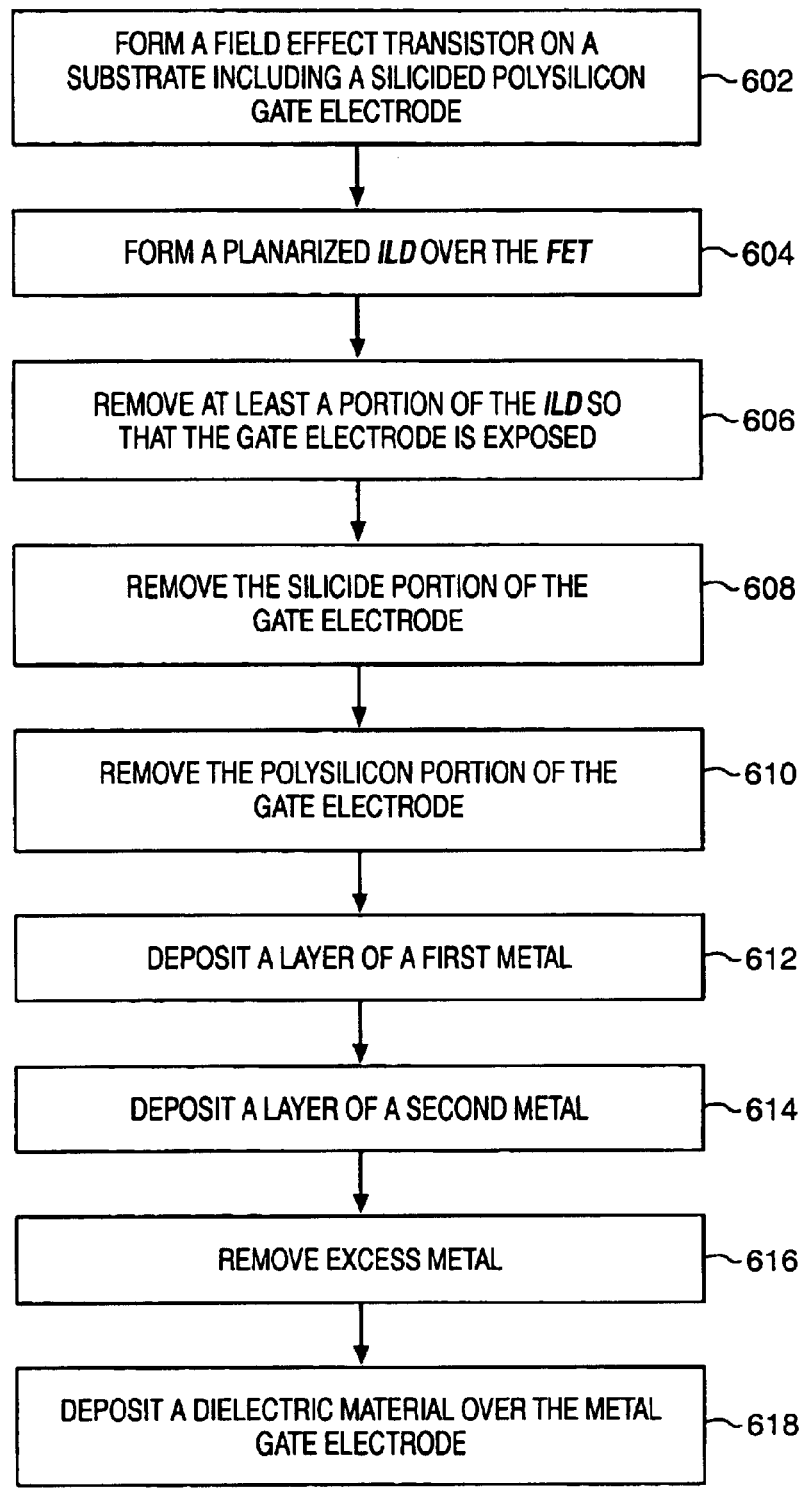
FIG. 13 is a flow diagram illustrating an alternative process in accordance with the present invention.

FIG. 13 is a flow diagram of an alternative process in accordance with the present invention. As shown at block 602, a field effect transistor including a silicided polysilicon gate electrode, is formed on a substrate. A planarized interlayer dielectric (ILD) is then formed 604 over the FET. A portion of the ILD is then removed 606 so that the gate electrode is exposed. The silicided portion of the gate electrode is removed 608, thereby creating a recess bounded at bottom by the underlying polysilicon, now exposed, and further bounded by the vertical interior walls of sidewall spacers that are adjacent to the gate electrode. As shown at block 610, the polysilicon is removed thereby enlarging the recess. A first metal layer is deposited 612 over the substrate such that at least the bottom of the recess is covered. A second metal is deposited 614 over the substrate such that at least the recess is substantially filled with the second metal. For PFETs the first metal is typically tantalum nitride and the second metal is typically selected from nickel, palladium and platinum. For NFETs, the first metal is typically titanium nitride and the second metal is typically aluminum. The present invention is not limited to these combinations of materials. Excess metal is removed 616, and a dielectric layer is deposited 618 over the FET having the replacement gate electrode.

In accordance with the present invention, integrated circuits may be constructed which have a plurality of FETs, of one or more conductivity types (i.e., p-channel, n-channel, or both), wherein the transistors of a particular conductivity type may have substantially identical channel doping profiles but different threshold voltages. The ability to achieve a range of threshold voltages without having to change the channel doping profiles of the FETs is a result of including a work function modulation layer in the gate electrode. By adjusting the thickness of the work function modulation layer between a first and a second critical thickness, the work function of the gate electrode, and consequently the threshold voltage of the transistor can be modified. In this way, a variety of transistor threshold voltages may be obtained simply by forming a corresponding variety of gate electrode stacks with different thicknesses of work function modulation layers, rather than requiring a series of ion implantation operations to modify the channel doping profiles.

Conclusion

Embodiments of the present invention provide bi-layer metal gate electrodes with work function modulated by one of the gate electrode layers.

An advantage of the embodiments of the present invention is that an integrated circuit may have a plurality of transistors with different threshold voltages formed thereon wherein those transistors share a common channel doping profile.

Although the illustrative embodiments have been described in connection with the use of specific materials, structures, and operations, it should be noted that many alterations are possible within the scope of the Claimed invention. For example, LOCOS (local oxidation of silicon) isolation structures may be substituted for shallow trench isolation structures.

It will be understood that various other changes in the details, materials, and arrangements of the parts and steps which have been described and illustrated may be made by those skilled in the art without departing from the principles and scope of the invention as expressed in the subjoined Claims.

What is claimed is:

1. An integrated circuit, comprising:
   an NFET having a gate electrode comprising a TiN layer superjacent a first gate dielectric, a first metal layer having laterally opposed vertical sidewalls, superjacent the TiN layer, wherein the TiN layer is adjacent to laterally opposed vertical sidewalls of the first metal layer; and
   a PFET having a gate electrode comprising a TaN layer superjacent a second gate dielectric, a second metal layer having laterally opposed vertical sidewalls, superjacent the TaN layer, wherein the TaN layer is adjacent to laterally opposed vertical sidewalls of the second metal layer.

2. The integrated circuit of claim 1, wherein the first metal layer comprises one selected from the group consisting of aluminum, titanium, or a combination thereof.

3. The integrated circuit of claim 1, wherein the second metal layer comprises one selected from the group consisting of nickel, platinum, palladium, or a combination thereof.

4. An microelectronic device, comprising:
   an NFET having a first gate electrode comprising a TiN layer superjacent a first gate dielectric and adjacent to at least a pair of sidewall spacers, the TiN layer forming a lining over interior walls of the sidewall spacers and over the gate dielectric; and
   a PFET having a second gate electrode comprising a TaN layer superjacent a second gate dielectric and adjacent to at least a second pair of sidewall spacers, the TaN layer forming a lining over interior walls of the second pair of sidewall spacers and over the second gate dielectric;
   wherein the first gate electrode comprises aluminum and the second gate electrode comprises a material selected from the group consisting of Ni, Pt, Pd, and a combination thereof.

5. An integrated circuit, comprising:
   a first FET of a first conductivity type, the first FET having a first work function modulation layer; and
   a second FET of a second conductivity type, the second FET having a second work function modulation layer;
   wherein the first and the second work function modulation layers comprise the same material, and wherein a thickness of the first work function modulation layer is different than a thickness of the second work function modulation layer.

6. The integrated circuit of claim 5, wherein the first and the second FETs have substantially identical channel doping profiles, and wherein the first and the second FETs have different threshold voltages.

7. A metal gate electrode comprising:
   a gate dielectric layer;
   spacers along laterally opposed sides of the gate dielectric layer;
   a metal nitride layer superjacent the gate dielectric layer, the metal nitride layer having a first work function; and
   a metal layer superjacent the metal nitride layer, the metal layer thicker than the metal nitride layer, the metal layer having a second work function and not being formed from a metal nitride.

8. The metal gate electrode of claim 7, wherein the metal nitride layer comprises a metal nitride selected from the group consisting of titanium nitride and tantalum nitride.

9. The metal gate electrode of claim 7, wherein the metal layer comprises a metal selected from the group consisting of aluminum, nickel, platinum and palladium.

10. The metal gate electrode of claim 9, wherein the metal nitride layer is less than 100 angstroms thick.

11. The metal gate electrode of claim 7, wherein the metal nitride layer comprises a work function modulation layer, a thickness of which is selected to achieve a particular work function.

12. The metal gate electrode of claim 7, wherein the metal nitride layer is selected from a material that provides a diffusion barrier from the metal layer to the gate dielectric.

13. A metal gate electrode comprising:
   a gate dielectric layer;
   spacers along laterally opposed sides of the gate dielectric layer;
   a metal work function modulation layer superjacent the gate dielectric layer, the metal work function modulation layer having a thickness selected to achieve a particular work function for the gate electrode; and
   a metal layer superjacent the metal work function modulation layer.

14. The metal gate electrode of claim 13, wherein the metal work function modulation layer comprises a metal nitride.

15. The metal gate electrode of claim 13, wherein the work function of the metal gate electrode is different from a work function of the metal work function modulation layer and a work function of the metal layer.

16. The metal gate electrode of claim 13, wherein the metal work function modulation layer has a thickness that is selected to achieve a threshold voltage.

17. The metal gate electrode of claim 13, wherein the metal work function modulation layer is selected from a material that provides a diffusion barrier from the metal layer to the gate dielectric layer.

* * * * *